United States Patent
Su et al.

(10) Patent No.: US 6,838,816 B2
(45) Date of Patent: Jan. 4, 2005

(54) LIGHT EMITTING DIODE WITH NANOPARTICLES

(75) Inventors: Wei-Fang Su, Taipei (TW); Ching-Fuh Lin, Taipei (TW)

(73) Assignee: National Taiwan University, Taipei (TW)

(*) Notice: Subject to any disclaimer, the term of this patent is extended or adjusted under 35 U.S.C. 154(b) by 130 days.

(21) Appl. No.: 10/159,255

(22) Filed: Jun. 3, 2002

(65) Prior Publication Data

US 2003/0222572 A1 Dec. 4, 2003

(51) Int. Cl.[7] .................................................. H01J 1/62
(52) U.S. Cl. ...................... 313/499; 313/506; 257/103; 362/800
(58) Field of Search ................................. 313/506, 505, 313/503, 498, 499; 445/50, 51; 362/800; 257/103, 40, 613, 82

(56) References Cited

U.S. PATENT DOCUMENTS

| | | | |
|---|---|---|---|
| 5,537,000 A | 7/1996 | Alivisatos et al. | 313/506 |
| 5,777,433 A | 7/1998 | Lester et al. | 313/512 |
| 5,966,393 A | 10/1999 | Hide et al. | 372/23 |
| 6,214,560 B1 | 4/2001 | Yguerabide et al. | 435/7.1 |
| 6,548,836 B1 * | 4/2003 | Rubner et al. | 257/103 |
| 6,558,575 B2 * | 5/2003 | Andriessen et al. | 252/301.6 S |
| 6,580,545 B2 * | 6/2003 | Morrison et al. | 359/265 |

* cited by examiner

*Primary Examiner*—Haissa Philogene
(74) *Attorney, Agent, or Firm*—Troxell Law Office PLLC

(57) ABSTRACT

The present invention discloses a simple, low cost method to fabricate light emitting source using luminescent colloid nanoparticles. It uses monodispersed colloid light emitting nanoparticles of oxides, semiconductors, and polymers to fabricate high quality, narrow bandwidth light emitting source. The colloid particles can be dispersed homogeneously in liquid that can be coated easily on a substrate using a simple coating method such as spray, dip coating or spin coating. There is no restriction on the size or shape of the substrate. Therefore, a low cost, large area, high efficiency and reproducible light emitting source can be made easily.

12 Claims, 6 Drawing Sheets

LIGHT EMITTING DIODE WITH NANOPARTICLES

FIELD OF THE INVENTION

The invention herein relates to a light emitting diode (LED), particularly, relates to a LED with nanoparticles.

BACKGROUND OF THE INVENTION

Recently, the epitaxy technique is getting more and more improved, so it is very possible to have a double heterostructure with excellent quality, and which may provide LED more than 90% quantum efficiency. However, emitting layer of a typical LED is formed by epitaxially growing; therefore, the growing speed is very slow.

Low-dimensional structures including nanoparticles or quantum dots (QDs) are supposed to provide significant enhancement in the density of states, so it increases the probability of light emission. Those low-dimensional structures can be epitaxially grown on bulk materials like GaAs wafers or separately formed by chemical methods.

Luminescent nanoparticles formed by chemical methods have many advantages. First, it can be dissolved in the solvent to become a solution. Second, it can be applied on any substrates by any process such as spray, dip coating, or spin coating. Third, the speed can be very fast (several micrometers per second); therefore, area or volume density of the material can be very high.

The expitaxially growing way is very selective on the grown substrates. Also, QDs are usually formed with only a scarce area density. Thus, the forming speed is very slow (such as several micrometers per hour). Furthermore, it also needs expensive vacuum equipment to carry out the necessary process. The process to fabricate monodispersed nanoparticles is inexpensive and facile for industrial application. Stimulated emission and optical gain had been demonstrated in CdS quantum dots by optical pumping methods. This encourages the employment of electrical pumping to realize efficient nanoparticle-based light emitting devices.

SUMMARY OF THE INVENTION

A light emitting diode (LED) with nanoparticles, which comprises a first electrode for electric conduction, a substrate for said LED to be grown thereon, a luminescent nanoparticles layer for emitting light, and a second electrode for electric conduction. Current flows through said luminescent nanoparticles layer by said first electrode and said second electrode for emitting light.

BRIEF DESCRIPTION OF THE DRAWINGS

The present invention will be better understood from the following detailed description of preferred embodiments of the invention, taken in conjunction with the accompanying drawings, in which.

DESCRIPTION OF THE PREFERRED EMBODIMENTS

The following descriptions of the preferred embodiments are provided to understand the features of the present invention.

Figure 1A:
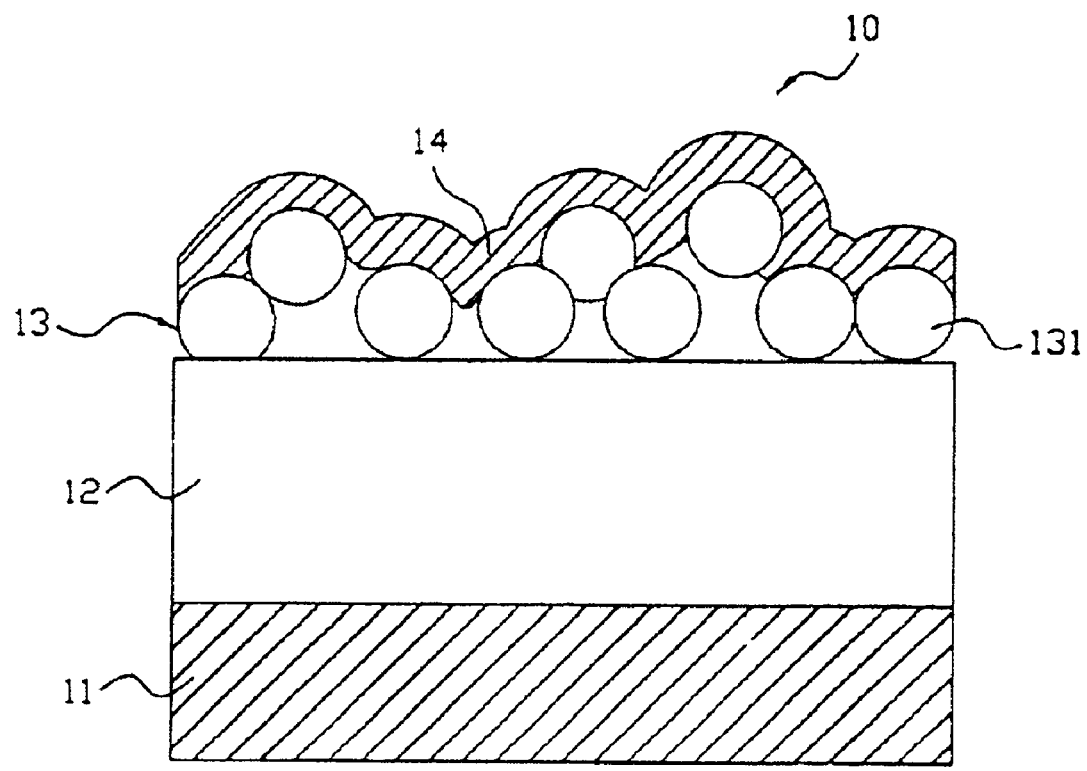
FIG. 1A and FIG. 1B show cross-section diagram of the present invention.

The present invention provides a light emitting diode (LED) with nanoparticles 10, please referring to the FIG. 1A, which comprises a first electrode 11 for electric conduction a substrate 12 for said LED to be grown thereon, a luminescent nanoparticles layer 13 for emitting light, and a second electrode 14 for electric conduction. Wherein said first electrode 12 may be an N-type electrode or a P-type electrode made by metal material, such as Au, Ag, Al, or Mg. Said substrate 12 may be a semiconductor substrate or an insulator substrate, typically, said substrate 12 is a silicon substrate. Similarly, said second electrode 14 may be an N-type electrode or a P-type electrode that is different to said first electrode 11, made by metal material, such as Au, Ag, Al, or Mg. Furthermore, said luminescent nanoparticles layer 13 substantially is an oxide luminescent nanoparticles layer, a semiconductor luminescent nanoparticles layer (such as CDs nanoparticles layer), or a macromolecule luminescent nanoparticles layer. In a preferred embodiment example, each nanoparticle 131 of said luminescent nanoparticles layer 13 has a specific diameter between 5 nm to 500 nm, particularly, when the diameter of nanoparticle 131 is smaller than 10 nm, the light emitting performance will be better. In addition, each luminescent nanoparticle of said luminescent nanoparticles layer 13 substantially is spreading uniformly for having high performance of emitting light.

Figure 1B:
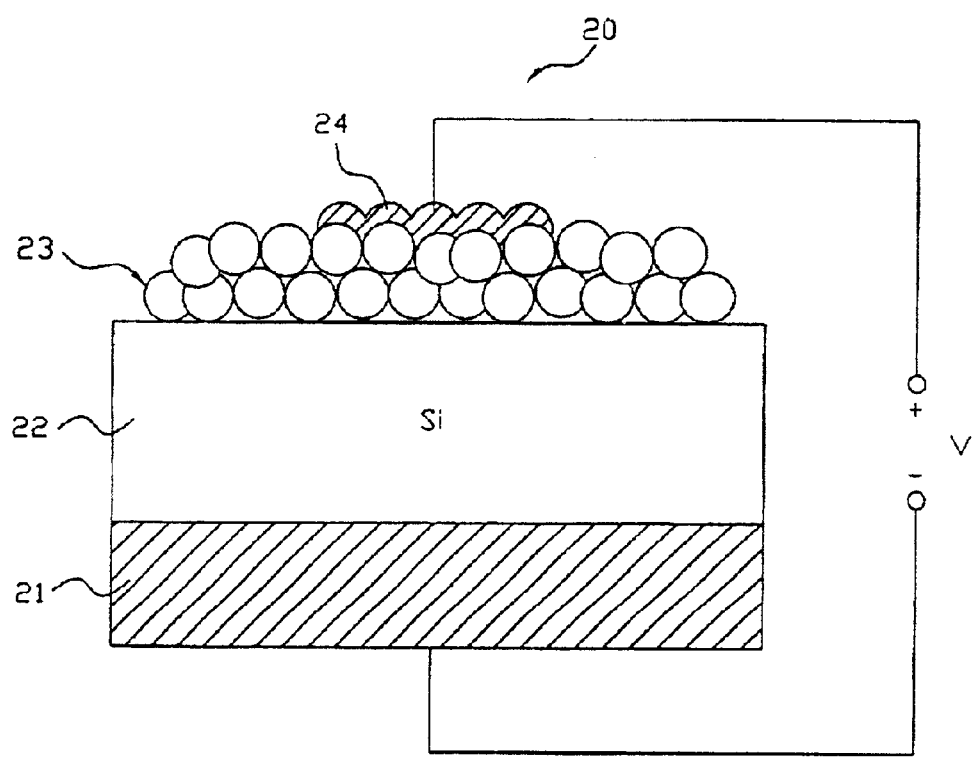

Referring to the FIG. 1B, current flows through said luminescent nanoparticles layer 23 by said first electrode 21 and said second electrode 24 for emitting light.

The luminescent nanoparticles provided in accordance with this invention is embodied as following example. First, redissolvable nanoparticles powder of CdS has been synthesized by modifying Pietro's method. Next, Cadmium acetate dihydrate [$Cd(CH_3COO)_2 \cdot 2H_2O$, 0.80 g, 3.0 mmole] was dissolved in a 20 ml mixed solvent of acetonitrile, methanol, and water with a volume ratio of 1:1:2 to form a first solution. A second solution containing disodium sulfide nanohydrate ($Na_2S \cdot 9H_2O$, 0.36 g, 1.5 mmole) and p-hydroxy thiophenol (0.56 g, 4.4 mmole) in the same solvent system was added into vigorously stirred cadmium acetate solution. The first solution and the second solution were putting together to stir for 18 hours without light illumination. After centrifuging and washing with deionized (DI) water for several times, it can be obtained that a 0.70 g yellow powder of CdS nanoparticles encapped by p-hydroxy thiophenol. By replacing part of cadmium acetate with manganese acetate, we prepared Mn doped CdS nanoparticles with different concentrations of manganese (5%, 10% and 20% in molar ratio). The diameter of the CdS nanoparticles is about 5 nm. With ultrasonic vibration and percolation, solutions for spin-coating purpose were produced by dissolving the nanoparticles in ethanol with a concentration of 1% (w/v).

Here is a preferred embodiment for fabricating CdS light emitting diode on Si wafer as follows in accordance with the present invention. First, a low resistivity (doping ~$10^{15}$ cm$^3$) silicon wafer was used as the substrate. Acetone, methanol, and DI water were used for subsequently cleaning procedure. The wafer was placed on spinner with several dips of the previously mentioned four CdS and CdS:Mn nanoparticle solutions. A spin speed of 4,000 rpm for 60 sec was used.

The general fabrication steps of CdS light emitting diodes (LEDs) are as follows. There are three different treatments with the devices:

[Sample 1]: The wafer was placed in a chamber, in which 75-mmHg air pressure and room temperature were maintained for 5 minutes to remove ethanol solvent.

[Sample 2]: The samples were subsequently treated by rapid thermal annealing (RTA) at 425° C. for 5 minutes. The annealing process took place with 75-mmHg air pressure. At this temperature, the organic chemical was decomposed.

[Sample 3]: The CdS nanoparticles are immersed into high oxygen concentration environment. The nanoparticle solutions (1%) had been separately mixed with SOG (spin-on-glass) 315FX and $SiO_2$ nanoparticles (6% by volume, average diameter of 12 nm, dissolved in isopropyl alcohol). The cleaned silicon substrate was spin coated with these two kinds of mixture solutions. Both samples were treated by RTA at 425° C.

Figure 2:
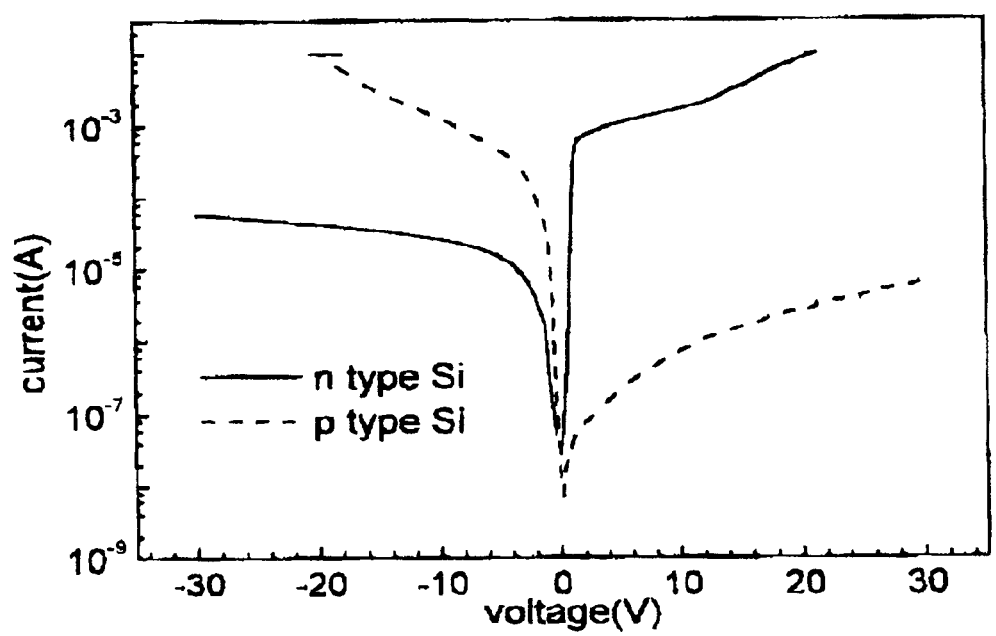
FIG. 2 shows I-V curve diagram in accordance with the present invention.
Figure 3A:
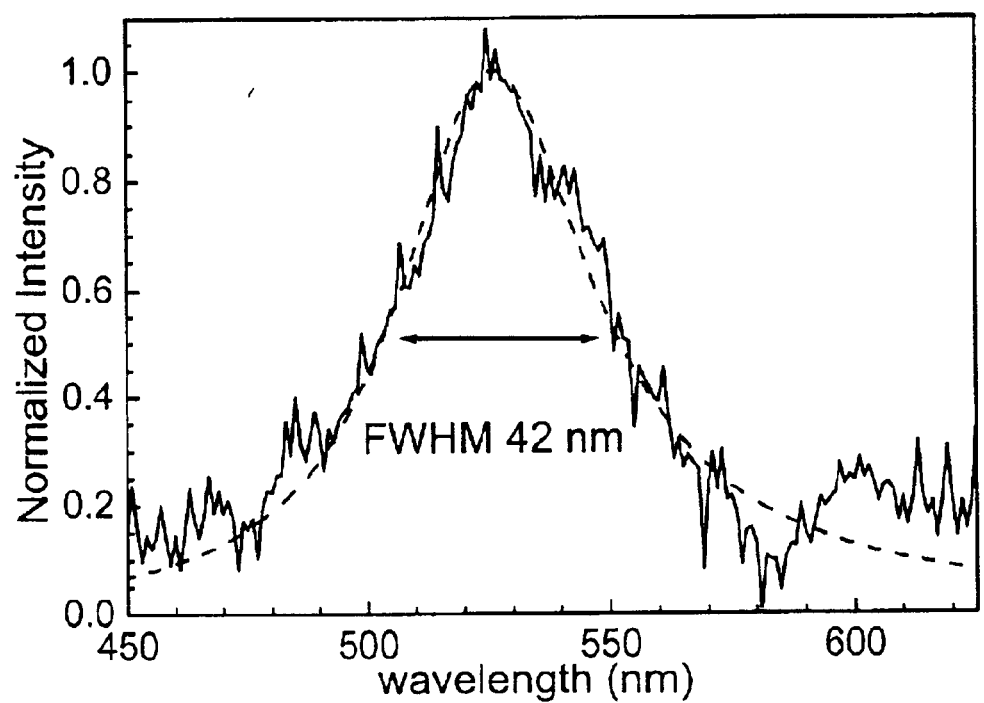
FIG. 3A~FIG. 3C show E-L spectra of CdS in different embodiment examples.
Figure 3B:
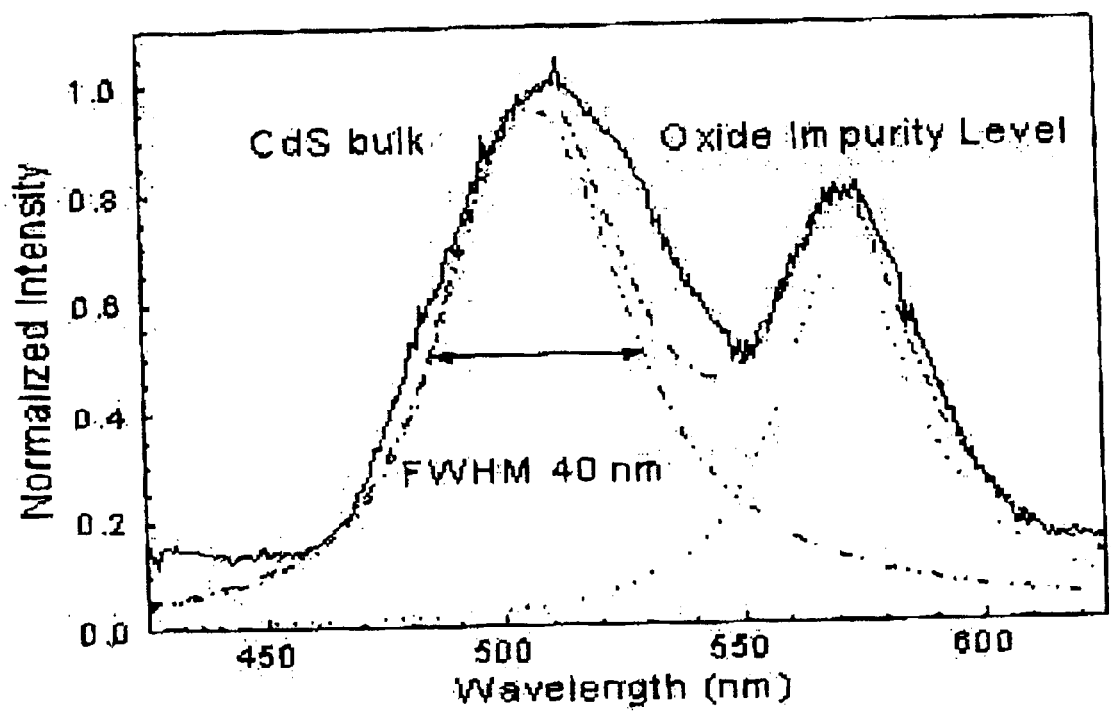
Figure 3C:
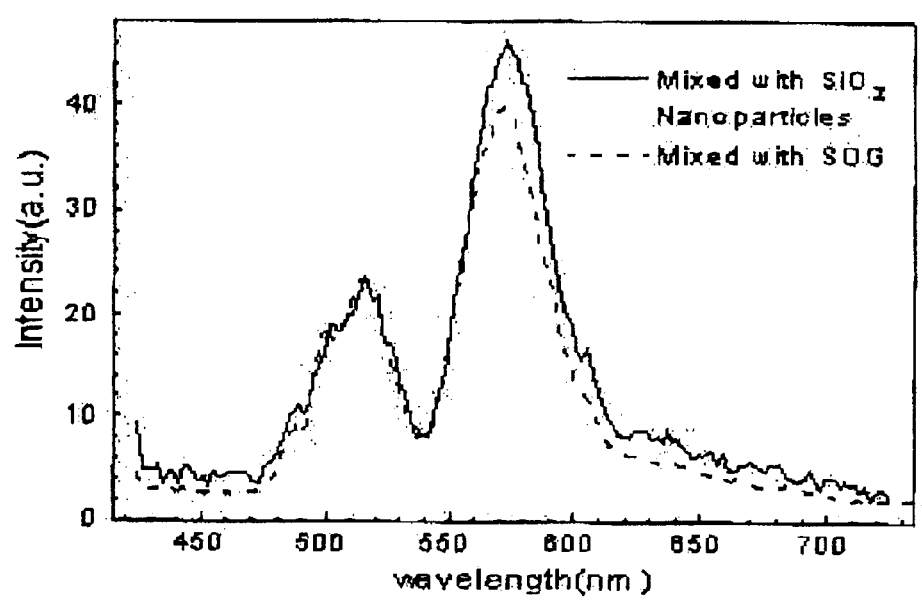

Subsequently, both top and bottom metal contacts were defined by thermal evaporation. The top semi-transparent contact layer was 10 nm gold, and the bottom layer was 150 nm gold. Before the deposition of Au layer, a 3-nm adhesion layer of chromium has been evaporated for both contacts. After 0.3 voltage bias was applied EL through top thin layer can be seen by naked eyes. Monochromator (CVI CM110) and photomultiplier were used to record the spectra. Please refer to the FIG 2. which shows I-V curve of devices on n-type and p-type Si respectively with a turning on point at around 3V. In the case of, [sample 1] both spectra of CDs and CDs doped with Mn are the same, as illustrated in FIG. 3A. The emission peak at 526.5 nm (2.355 eV) is red-shifted from bulk CDs A-exciton transition energy, 2.441 eV(508 nm) at room temperature. The EL spectrum of [sample 21] depicted in FIG. 3B shows two peaks. One is at 513.7 nm and another is at 571.5 nm. The former peak stands for bulk CDs signal (A-exciton) that has been decreased from 526.5 nm to 513.7 nm with increasing processing temperature from room temperature to 450° C. This spectral lobe can be fitted by Lorentzian shape with scattering time of 8 fs and FWHM 40 nm. The peak at 571.5 nm results from the trapped carriers in oxygen-impurity levels. High temperature environment and the decomposition of p-hydroxy thiophenol group cause the diffusion process of oxygen into the nanoparticles to occur. For investigating the luminescent phenomenon of oxygen impurity level, we used SOG and $SiO_2$ nanoparticles as oxygen source and mixed then respectively with CDs nanoparticles. Their EL spectra [sample 3] are shown in FIG. 3C. The peak at 513.7 nm (2.414 eV) is the A-exciton signal of bulk CDs at 65° C. A new light emits at 571.5 nm that corresponds to radiative transition due to carriers trapped in oxygen-impurity levels, as mentioned previously. The magnitude of light emission in these samples is ten times stronger than that from unheated samples (sample 1) for the same carrier injection condition. These unusual changes in the wavelength and intensity of light emission from the diodes provide a useful and simple way to fabricate tunable light emitting sources.

The CdS nanoparticles prepared by chemical method are ready for spin-coating and EL device fabrication. The observed a spectral shift of free exciton transition of 86 meV is due to the passivation of p-hydroxy thiophenol group around nanoparticles. Process modifications such as heat treatment and oxygen-rich environment are influential to intrinsic green emission of CdS nanoparticles. The p-hydroxy thiophenol molecule has shown a protection effect to avoid the diffusion of contaminants into nanoparticles, but it cannot resist temperature deterioration above 400° C. Radiative recombination of carriers trapped in oxygen-impurity levels presents a 273 meV of below bandgap energy of bulk CdS. With the oxygen-impurity levels formed at the surface of CdS nanoparticles, luminescence increases by an order of magnitude. In addition, luminescent nanoparticles formed by chemical methods have many advantages. First, it can be dissolved in the solvent to become a solution. Second, it can be applied on any substrates by any process such as spray, dip coating, or spin coating. Third, the speed can be very fast (several micrometers per second); therefore, area or volume density of the material can be very high. Therefore, the LED with nanoparticles provided by this invention may reduce the production cost and increase the size of LED.

The present invention may be embodied in other specific forms without departing from the spirit of the essential attributes thereof; therefore, the illustrated embodiment should be considered in all respects as illustrative and not restrictive, reference being made to the appended claims rather than to the foregoing description to indicate the scope of the invention.

What is claimed is:

1. A light emitting diode (LED) with luminescent nanoparticles comprising:
   a) a substrate;
   b) one colloid luminescent nanoparticles layer grown on a first surface of the substrate;
   c) a first electrode formed on a second surface of the substrate; and
   d) a second electrode formed on the luminescent nanoparticles layer, wherein the colloid luminescent nanoparticles layer emits a light when a current flows between the first and second electrodes, the LED having light emitting spectra tunable between 526 nm and 57 nm and a turn on voltage of 3V.

2. The LED according to claim 1, wherein said luminescent nanoparticles layer is an oxide luminescent nanoparticles layer.

3. The LED according to claim 1, wherein said luminescent nanoparticles layer is a semiconductor luminescent nanoparticles layer.

4. The LED according to claim 1, wherein said luminescent nanoparticles layer is a macromolecule luminescent nanoparticles layer.

5. The LED according to claim 3, wherein said luminescent nanoparticles layer is a CDs nanoparticles layer.

6. The LED according to claim 1, each luminescent nanoparticle of said luminescent nanoparticles layer has a specific diameter between 5 nm to and 500 nm.

7. The LED according to claim 1, wherein the colloid luminescent nanoparticles layer has a uniform thickness.

8. The LED according to claim 1, wherein said substrate is a semiconductor substrate.

9. The LED according to claim 1, wherein said substrate is an insulator substrate.

10. The LED according to claim 8, wherein said substrate is a silicon substrate.

11. The LED according to claim 1, wherein said first electrode is comprised of a material selected from a group consisting of Au, Ag, Al, and Mg.

12. The LED according to claim 1, wherein said second electrode is comprised of a material selected from a group consisting of Au, Ag, Al, and Mg.

* * * * *